United States Patent [19]

Tunzi

[11] 3,725,905

[45] Apr. 3, 1973

[54] MONOLITHIC ANALOG-TO-DIGITAL CONVERTER

[76] Inventor: Burton R. Tunzi, 10090 North Blaney, Cupertino, Calif. 95014

[22] Filed: Aug. 2, 1971

[21] Appl. No.: 168,105

[52] U.S. Cl. ......................340/347 AD, 340/347 CC
[51] Int. Cl. ............................................H03k 13/02
[58] Field of Search ......307/235, 228, 265; 328/127, 328/151, 183; 340/347 AD, 347 NT, 347 CC

[56] References Cited

UNITED STATES PATENTS

| | | | |
|---|---|---|---|
| 3,390,354 | 6/1968 | Munch | 340/347 NT |
| 2,979,708 | 4/1961 | Jorgensen | 340/347 NT |
| 3,462,758 | 8/1969 | Reynal | 340/347 NT |
| 3,555,298 | 1/1971 | Neelands | 340/347 NT |
| 3,599,203 | 8/1971 | Conley | 340/347 NT |

*Primary Examiner*—Maynard R. Wilbur
*Assistant Examiner*—Jeremiah Glassman
*Attorney*—Thomas E. Schatzel and Claude A. S. Hamrick

[57] ABSTRACT

A self- contained fully integrated, monolithic analog-to-digital converter including, a linearized ramp generator for providing a reference voltage, a comparator for comparing the reference voltage to an unknown voltage, one or more differential amplifying stages, a cross-over network for providing semiconductor components mismatch compensation, a flip-flop for generating output pulses having widths proportional to the unknown voltage, and a counter responsive to the flip-flop output for developing a digital output signal commensurate with the unknown voltage.

8 Claims, 8 Drawing Figures

INVENTOR.
BURTON R. TUNZI
BY
Lowhurst & Hamrick
ATTORNEYS

INVENTOR
BURTON R. TUNZI

BY

Lowhurst & Hamrick
ATTORNEYS

INVENTOR.
BURTON R. TUNZI
BY
Lowhurst & Hamrick
ATTORNEYS

MONOLITHIC ANALOG-TO-DIGITAL CONVERTER

BACKGROUND OF THE INVENTION

1. Field of the Invention

The present invention relates generally to analog-to-digital converters and more particularly to a novel self-contained, monolithic analog-to-digital converter having a high degree of accuracy over a wide range of operational temperatures.

2. Description of the Prior Art

Although integrated circuitry has for some time now been used in the manufacture of analog-to-digital (A/D) converters, such applications have typically required the use of several discreet components rather than having the entire converter self-contained on a single semiconductive substrate. This is, in part, due to the difficulties encountered in providing adequate temperature compensation and drift stability for the various semiconductive devices forming the converter. In one prior art type of A/D converter commonly referred to as an integrated A/D converter (see U.S. Pats. to Gilbert No. 3,051,939 and Ammann No. 3,316,547), a capacitor is usually charged by the unknown voltage and the time required to build up a particular level of charge is used to provide the output signal. This method, however, is disadvantageous in that it is difficult to compensate for variations in the operating characteristics of the capacitor over a period of time and under differing environmental conditions. Furthermore, in attempting to reproduce such prior art circuits in monolithic form, the instabilities of the monolithic components cause the operational performance to be less than desirable.

SUMMARY OF THE INVENTION

In accordance with the present invention, a monolithic analog-to-digital converter device is provided which includes a highly stable ramp generating circuit for generating a repeatable ramp voltage. A comparator circuit compares the ramp voltage to the unknown voltage and the results of the comparison are coupled through a cross-over network and one or more differential amplifying stages into a flip-flop which changes state upon coincidence between the two voltages and provides an output pulse having a width proportional to the magnitude of the unknown voltage. The ramp generator portion of the circuit includes a monolithic capacitor in series with a first field effect transistor (FET) which serves as a constant current source, and in parallel with a second FET which serves as a shorting switch for discharging the capacitor following each cycle of operation. In order to insure that the ramp generator generates a repeatable, highly accurate ramp voltage for comparison with the unknown voltage, reference is made to a set of transfer curves (for different operational temperatures) for the first FET device and the gate potential therefore is chosen at the value for which the drain-to-source current of the FET remains substantially constant independent of temperature. During alternate cycles of operation, the FET cross-over network routes the signals corresponding to the two voltages through first one side of the successive amplifying stages and then the other to compensate for errors which might otherwise occur due to mismatch of components in the various amplifiers.

One of the principal advantages of the present invention is that an entire A/D converter circuit is provided which can be integrated on a single semiconductive wafer, with the only external electronics required being those required to provide the various operating potentials. Another advantage of the present invention is that since the wafer surface area required to accommodate the converter circuit is small, a plurality of independent, or operationally associated, circuits can be provided on a single semiconductive "chip".

These and other advantages of the present invention will undoubtedly become apparent to those skilled in the art after a reading of the following description of the preferred embodiments which are illustrated in the several figures of the drawing.

IN THE DRAWING

DETAILED DESCRIPTION OF THE PREFERRED EMBODIMENTS

Figures 1, 2, 3, 4:
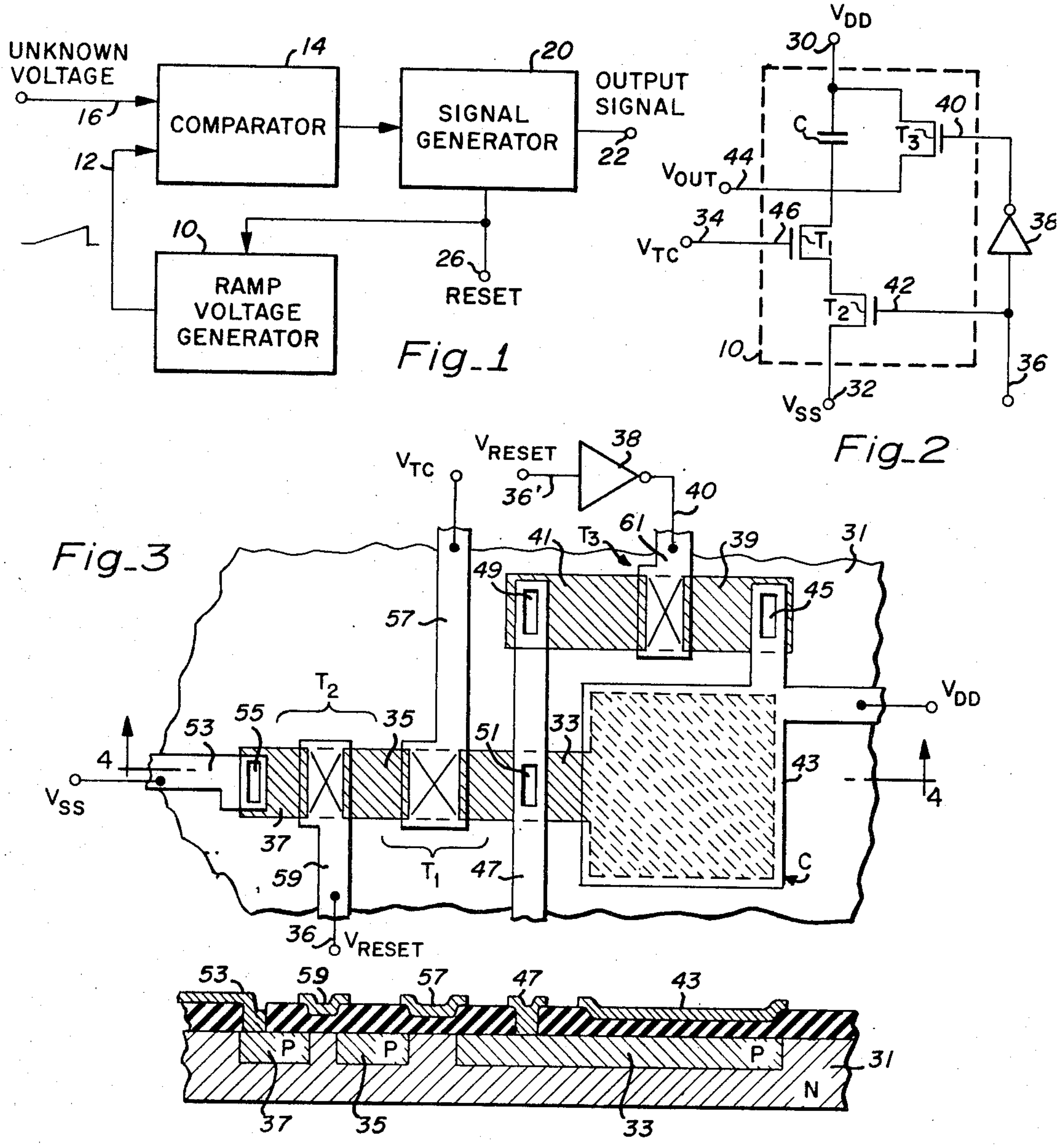
FIG. 1 is a block diagram broadly illustrating the component parts of an A/D converter in accordance with the present invention.
FIG. 2 is a schematic diagram illustrating a ramp voltage generator in accordance with the present invention.
FIG. 3 shows the ramp voltage generator in simplified monolithic form.
FIG. 4 is a cross section taken along the line 4—4 in FIG. 3.

Referring now to FIG. 1 of the drawing, a simplified block diagram of an analog-to-digital converter in accordance with the present invention is illustrated. Broadly, the converter includes a ramp voltage generator 10 which generates a highly linear ramp voltage for input into one of the input terminals 12 of a comparator 14 which compares the ramp voltage to an unknown voltage input into another input terminal 16. In response to equality between the two input voltages, comparator 14 is operative to develop an output signal at terminal 22 that is commensurate with the magnitude of the unknown voltage.

As will be explained in more detail below, an initial reset signal applied at reset terminal 26 causes generator 10 to begin developing a linearly increasing ramp voltage for comparison with the unknown voltage. When coincidence is determined by comparator 14, signal generator 20 develops an output signal commensurate with the magnitude of the unknown voltage and simultaneously resets ramp voltage generator 10 so that it commences a new comparison cycle.

The primary components of ramp voltage generator 10 are shown in simplified schematic form in FIG. 2 and in simplified monolithic form in FIGS. 3 and 4. As illustrated, generator 10 includes a monolithic capacitor C in series with an MOSFET $T_1$ and an MOS FET $T_2$, and a third MOS FET $T_3$ coupled in parallel with capacitor C. The monolithic device is made using well-known integrated circuit metal-oxide-semiconductor (MOS) techniques and briefly includes an n-type substrate 31 having a plurality of p-type regions diffused thereinto. The p-type region 33 forms both the lower plate of capacitor C and the drain for $T_1$. Region 35 provides both the source for $T_1$ and the drain for $T_2$, and region 37 provides the source for $T_2$. P-type regions 39 and 41 form the drain and source for $T_3$, respectively. The metal layer 43 provides the upper plate for capacitor C and forms an ohmic contact to drain region 39 at 45. The metal interconnect 47 ohmically contacts source region 41 at 49 and drain region 33 at 51. Metal interconnect 53 ohmically contacts source region 37 and 55 and the terminal portions of interconnects 57, 59 and 61 form the gates for transistors $T_1$, $T_2$ and $T_3$, respectively.

When a negative source of potential $V_{DD}$ is coupled to terminal 30 and a positive source of potential $V_{ss}$ is coupled to terminal 32, and a fixed gate voltage is applied to terminal 34, $T_1$ acts as a current source for charging capacitor C at a fixed rate. $T_2$ and $T_3$ serve as switches which respectively terminate the charging of capacitor C, and discharge capacitor C in response to the application of a discharge potential to terminal 36. An inverter 38 is coupled between reset terminal 36 and the gate 40 of $T_3$ so that when $T_2$ is biased conductive $T_3$ is biased nonconductive and vice versa. Note also that instead of using $T_2$ as indicated, the charging current for capacitor C could be interrupted by selectively shorting gate 46 of $T_1$ to ground.

In operation, the bias voltage applied to terminal 36 is sufficient to bias $T_2$ conductive, and when inverted by inverter 38 is sufficient to bias $T_3$ nonconductive so that a fixed current controlled by current source $T_1$ will charge capacitor C at a linear rate. However, when a discharge pulse is applied to terminal 36, $T_2$ is turned OFF, thereby disabling current source $T_1$, and $T_3$ is turned ON to provide a short across capacitor C, thereby discharging capacitor C of any charge previously stored therein. Following termination of the discharge pulse, $T_2$ will turn back ON and $T_3$ will turn OFF, and capacitor C will be charged at a linear rate dependent upon the RC characteristics of the capacitor and the charging circuit. The output voltage $V_{out}$ appearing at terminal 44 will also increase linearly to provide the ramp voltage for input to comparator 14.

Figure 5:
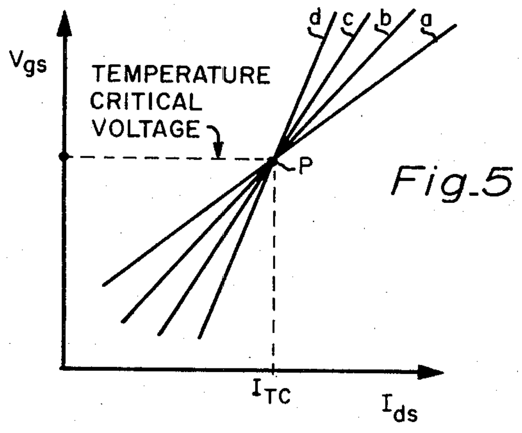
FIG. 5 is a transfer characteristic diagram for an FET illustrating transfer characteristic variation as a function of temperature.

In order for the converter to be operational with an acceptable degree of accuracy, ramp generator 10 must be capable of providing a very linear and repeatable ramp voltage which does not vary over a given operational temperature range. It has been found that a particular gate potential exists for each FET which causes the drain-to-source current $I_{ds}$ of the device to remain constant over a particular temperature range. This potential, which I choose to designate as the temperature critical voltage $V_{TC}$, can be determined by plotting the transfer characteristics of the device at several temperatures within the intended operational range. As illustrated in FIG. 5 of the drawing, which shows four curves *a*, *b*, *c* and *d* representing the transfer characteristics for a particular FET at temperatures within the range of from −55°C to +125°C, the transfer characteristics tend to intersect in the vicinity of the point P which identifies the temperature critical voltage $V_{TC}$ as well as the corresponding value of drain-to-source current $I_{TC}$. Thus, by using this particular voltage to bias the gate 46 of current source $T_1$, capacitor C can be charged at a linear rate which is independent of temperature changes over at least the operating range of from −55°C to +125°C. Note also that if a particular capacitor C exhibits a slight capacitive variation with temperature, selection of a gate potential slightly above or below the temperature critical voltage can be used to compensate for such variation.

Figure 6:
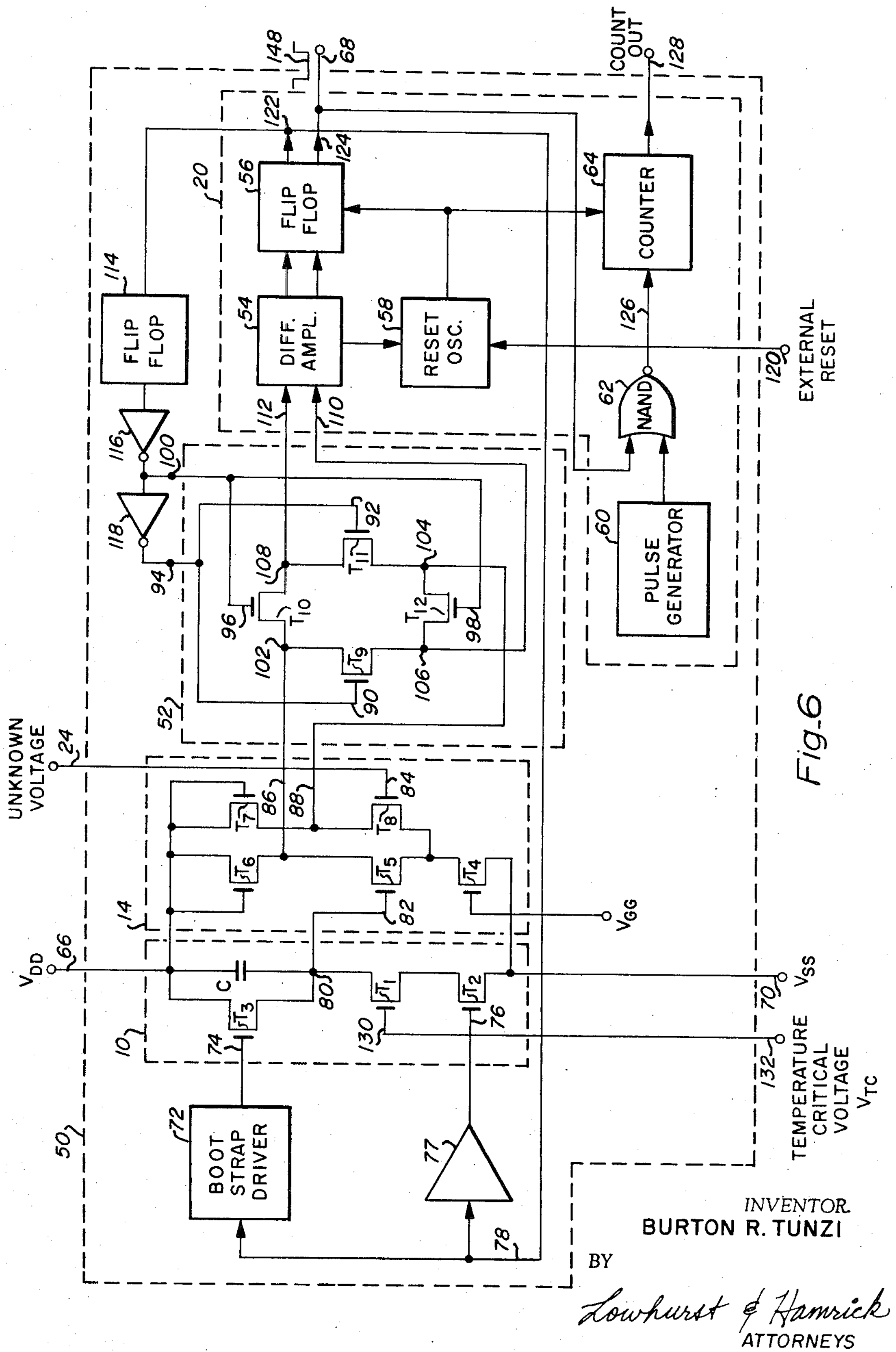
FIG. 6 is a schematic diagram illustrating an A/D converter in accordance with the present invention.

Referring now to FIG. 6 of the drawing, a more detailed showing of an embodiment of the present invention suitable for integration in a single MOS integrated circuit is illustrated in partial schematic and partial block diagram form. Although it will be appreciated that certain modifications may be made to the circuits schematically shown, these preferred circuits are used to illustrate certain features of the invention. Other circuit components are, for the sake of simplicity, shown in block diagram form and well-known, standard MOS circuits can be utilized therefor. In addition to the usual sources of biasing potentials, the only external component required to make the illustrated device fully functional is a stabilized power supply capable of providing the selected temperature critical voltage. This power supply could, however, also be integrated into the circuit. All other components are monolithically formed on the semiconductive wafer represented by the dashed lines 50.

As pointed out above with reference to FIG. 1, the converter is basically comprised of a ramp generator 10, a comparator 14, and a signal generator 20. However, as shown, signal generator 20 also includes one or more differential amplifier stages 54, a flip-flop 56, a reset oscillator 58, a pulse generator 60, a NAND gate 62 and a counter 64. A cross-over network 52 is provided for coupling the output of comparator 14 into the input of generator 20 so as to balance out small signal errors due to transistor mismatch in the amplifier circuits. Briefly, in operation, comparator 14, which may take the form of a differential amplifier compares the ramp voltage developed by generator 10 with the unknown voltage applied at terminal 66. The output of comparator 14 is coupled into differential amplifier 54 by cross-over network 52 where it is amplified and then used to drive flip-flop 56. When equality occurs between the ramp voltage and the reference voltage, i.e., comparator 14 develops a coincidence signal, the output of flip-flop 56 is changed from one state to the other thereby defining the trailing edge of a width modulated pulse whose width is directly related to the magnitude of the unknown voltage. The width modulated pulse may either be taken out at a first output terminal 68 or be fed into the input of counter 64 which develops a digital count output signal proportional to the width of the pulse. The circuit may be caused to make a single evaluation of unknown voltage or make repetitive evaluations. Where repetitious evaluations are to be made, cross-over network 52 switches the inputs to differential amplifier 54 at the end of each cycle so that errors which might otherwise occur due to slight mismatch of components in amplifier 54 are compensated for. Alternatively, cross-over network 52 could be positioned in front of comparator 14 so that the ramp voltage and the unknown voltage are alternately switched between the two inputs to comparator 14.

Ramp generator 10 includes three FETs ($T_1$, $T_2$ and $T_3$) and a monolithic capacitor C. Capacitor C, FET $T_1$ and FET $T_2$ are connected in series between the drain bias supply terminal 66 and the source bias supply terminal 70, with $T_1$ serving as a constant current source for supplying charging current to capacitor C, and $T_2$ serving as a switch for periodically disabling current source $T_1$ at the end of each comparison cycle. FET $T_3$ is connected in shunt across capacitor C, and when gated On provides a short across capacitor C to completely discharge it.

Following each measurement cycle shorting switch $T_3$, which is normally biased into its OFF state, is gated ON by bootstrap driver 72 which, in response to the resetting of flip-flop 56, applies an appropriate turn-on potential to gate 74. Since capacitor C must be fully discharged at the start of each measurement cycle, it is also necessary that current source $T_1$ be disabled to insure that current is not fed into C during the discharge operation. Switch $T_2$ provides this function in response to the application of a potential to its gate 76 suitable to turn it OFF, thereby interrupting the current path to source $V_{ss}$.

In order to coordinate the operations of switches $T_2$ and $T_3$ so that $T_3$ is ON when $T_2$ is OFF and vice versa, the same controlling signal (on line 78) applied to bootstrap driver 72 is applied after amplification by amplifier 77 to gate 76. Although the bootstrap driver 72 is preferred, a suitable high voltage amplifier may also be used to drive switch $T_3$.

The output of ramp generator 10 is taken at node 80 and applied to one input of comparator circuit 14, which is embodied in the form of a differential amplifier. Comparator 14 includes five FETs ($T_4$, $T_5$, $T_6$, $T_7$ and $T_8$). $T_4$ serves as a current source coupling the sources of amplifiers $T_5$ and $T_8$ to $V_{DD}$ at terminal 66. The ramp voltage developed at node 80 is directly coupled to gate 82 of amplifier $T_5$ and the unknown voltage to be measured is applied to gate 84 of amplifier $T_8$ via the input terminal 24.

At the start of each comparison cycle, the difference in potential across the comparators output lines 86 and 88 will be of one polarity, will go to zero as the ramp voltage applied to gate 82 becomes equal to the unknown voltage applied to gate 84, and then will be of the opposite polarity as the ramp voltage begins to exceed the unknown voltage. This change in polarity of the potential across lines 86 and 88 provides the coincidence signal which is amplified by differential amplifier 54 and used to drive flip-flop 56. Amplifier 54 may include several MOS amplifying stages and appropriate level shifting circuitry for shifting the output levels of the amplified signals up or down to the operating potentials of flip-flop 56.

Cross-over network 52 is comprised of a bridge circuit including four FETs ($T_9$, $T_{10}$, $T_{11}$ and $T_{12}$) with the gates 90 and 92 of $T_9$ and $T_{11}$ respectively, being coupled together and to a control terminal 94, and the gates 96 and 98 of $T_{10}$ and $T_{12}$ respectively, being coupled together and to a control terminal 100. Comparator output line 86 is connected to bridge node 102 and comparator output line 88 is connected to bridge node 104. The output of cross-over network 52 is taken across nodes 106 and 108 which are respectively coupled to the inputs 110 and 112 of differential amplifier 54. Drive for cross-over network 52 is provided by a second flip-flop 114 which is responsive to one of the outputs of flip-flop 56 and changes state at the termination of each comparison cycle. The output of flip-flop 114 is coupled into amplifiers 116 and 118 which raise the signals to a level suitable for driving the cross-over network FETs.

Following each comparison cycle, flip-flop 114 (which acts as a toggle switch) changes state so as to cause either $T_9$ and $T_{11}$, or $T_{10}$ and $T_{12}$ to be rendered conductive. With $T_9$ and $T_{11}$ conductive, the voltage on line 86 is coupled through $T_9$ to input 110 of amplifier 54, while the voltage on line 88 is coupled through $T_{11}$ to input 112 of amplifier 54. On the other hand, when $T_{10}$ and $T_{12}$ are rendered conductive, the voltage on line 86 is coupled through $T_{10}$ to amplifier input 112 and the voltage on line 88 is coupled through $T_{12}$ to input 110. As indicated above, the primary purpose of this cross-over function is to minimize any error which might otherwise result due to mismatch of the circuit components.

At the beginning of each comparison cycle, flip-flop 56 is reset to start the measuring period. Flip-flop 56 may be periodically reset by an internal reset oscillator 56, or the reset operation may be externally effected through the use of an external reset signal applied at terminal 120. Upon the occurence of equality between the reference voltage and the unknown voltage, the measuring period is terminated as the outputs of flip-flop 56 change to the opposite signal states. The measuring period is thus defined by width modulated pulses, developed by flip-flop 56, which are directly related in time duration to the magnitude of the unknown voltage. An output terminal 68 is provided to allow a pulse width type of output signal to be taken out of the converter if desired.

Pulse generator 60 provides a train of pulses of fixed frequency which are counted by counter 64 during the period between the beginning of each comparison cycle and the occurrence of coincidence between the ramp voltage and the unknown voltage. The number of pulses input to counter 64 is controlled by a NAND gate 62 which is responsive to the output signal developed at flip-flop terminal 122. The reset signal provided by reset oscillator 58 is also fed into counter 64 at the end of each cycle so that it will be ready to commence counting at the start of the following cycle. Although the output of counter 22 is illustrated as being provided at a single terminal 128 at which a serial count may be taken, it is to be understood that multiple output terminals could also be utilized to provide an output comprised of a particular number of binary bits.

Once fabricated, the converter is tested to determine the transfer characteristics of the current source $T_1$ and these characteristics are plotted for various temperatures over the operational range. The characteristics will resemble the generalized curves illustrated in FIG. 5 of the drawing. The gate-to-source voltage corresponding to the intersection point P of the transfer characteristic curver is then determined and designated the temperature critical voltage, $V_{TC}$, for that particular comparator circuit. With the voltage $V_{TC}$ applied to gate 130 via terminal 132, the converter can be utilized to measure any unknown voltage within the operational range of the device by simply coupling the unknown voltage into terminal 24 assuming, of course, that a suitable drain potential ($V_{DD}$) and source potential ($V_{ss}$) are also applied at terminals 66 and 70, respectively. Once the converter is so energized, it will be entirely self-operating and will provide a pulse-width type of output signal at output terminal 68, and a digital count output signal at output terminal 128.

Figure 7:
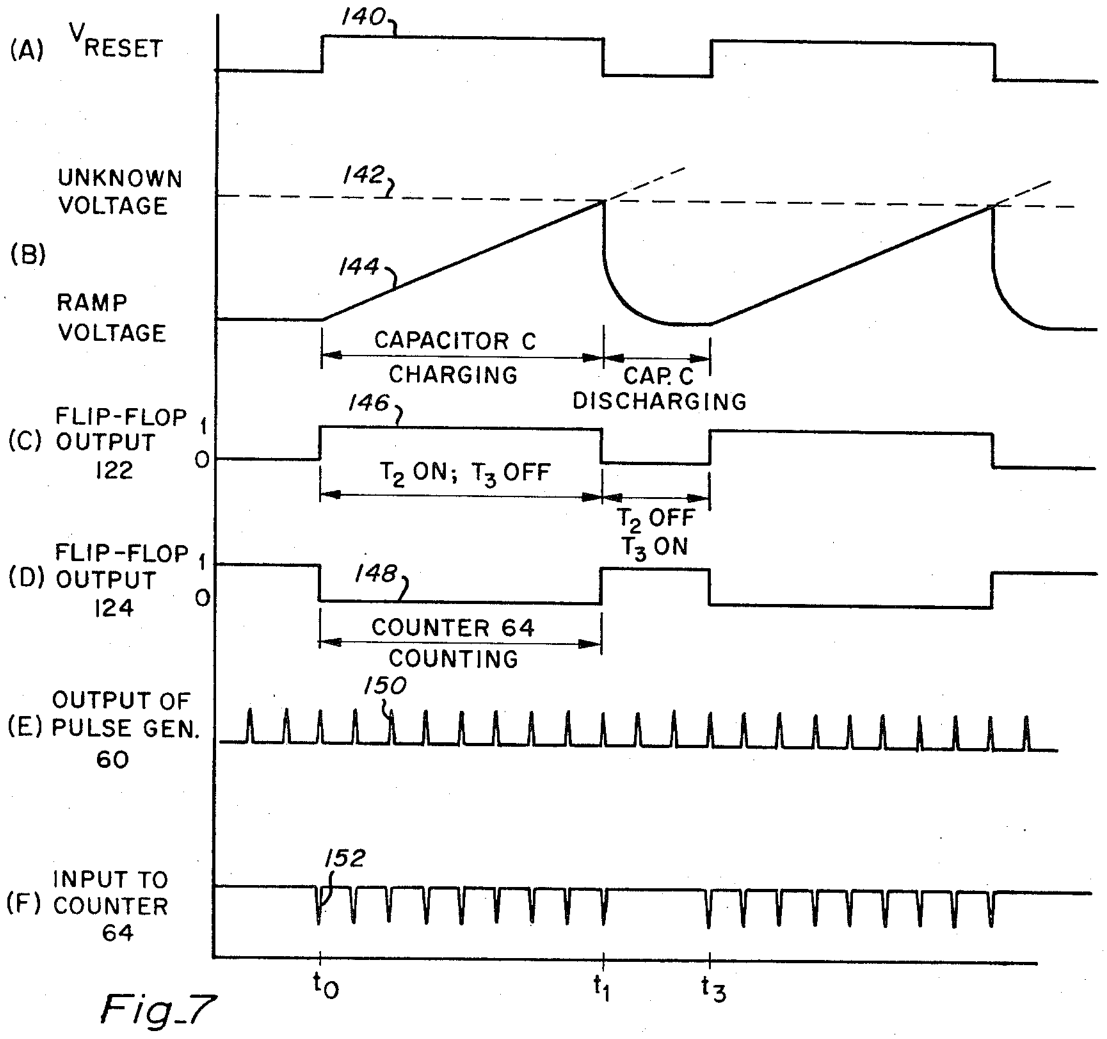
FIG. 7 is a timing diagram illustrating the operation of the A/D converter shown in FIG. 4.

More particularly, the operation of the converter illustrated in FIG. 6 can be explained by referring to the timing diagram illustrated in FIG. 7 of the drawing. In part (A), the output, $V_{reset}$, of reset oscillator 58 is shown at 140. $V_{reset}$ is used to reset flip-flop 56 and counter 64 at the beginning of each comparison cycle. In part (B), an unknown voltage applied to terminal 24 is illustrated at 142, and the ramp voltage developed by ramp generator 10 is illustrated at 144. In parts (C) and (D), the outputs of flip-flop 56 are illustrated at 146 and 148. In part (E), the output of pulse generator 60 is illustrated at 150, and in part (F) the input to counter 64 is illustrated at 152.

With capacitor C initially discharged ($T_3$ ON and $T_2$ OFF) and the unknown voltage 142 applied to terminal 24, an external reset or start signal applied to terminal 120 at time $t_o$ will cause flip-flop 56 to be reset to develop a logical "1" at output 122 and a logical "0" at output 124. The output at 122 is coupled via line 78 into bootstrap driver 72 and into amplifier 77. Responsive thereto bootstrap driver 72 develops a voltage for application to gate 74 to turn switch $T_3$ OFF, and amplifier 77 develops a voltage for application to gate 76 to turn switch $T_2$ ON. As switch $T_2$ is switched ON, current source $T_1$ is enabled and supplies a charging current of a predetermined fixed value to capacitor C thereby charging capacitor C at a linear rate and developing the ramp voltage 144 at terminal 80.

Also, at time $t_o$ the output at terminal 124 is applied to NAND gate 62 and enables the output of pulse generator 60 to be inverted as shown at 152 in FIG. 7 and input into counter 64. When ramp voltage 144 reaches the level of unknown voltage 142 at time $t_1$ (coincidence occurs) and begins to exceed that voltage, the relative polarity of the voltage difference across lines 86 and 88 changes and causes flip-flop 56 to change state and develop a "0" at output 122 and a "1" at output 124. As this occurs, the "0" appearing at output 122 causes switch $T_2$ to be turned OFF interrupting current source $T_1$, and $T_3$ to be turned ON to discharge capacitor C. Simultaneously, the "1" at 124 causes NAND gate 62 to prevent the output of pulse generator 60 from being input to counter 64 thereby terminating the count. At time $t_3$, reset oscillator 58 again resets flip-flop 56 and counter 64, and causes a second comparison cycle to begin.

Since the ramp voltage 144 is highly linear for reasons pointed out above, and is accurately repeatable during each comparison cycle, the time duration of the signal 148 developed at output terminal 68 will be accurately commensurate with the magnitude of the unknown voltage. And since NAND gate is controlled by signal 148, the number of pulses from generator 60 which are input into and counted by counter 64 will provide an accurate digital indication of the unknown voltage at output terminal 128.

As pointed out above, all of the components illustrated in either block diagram form or logic notation in FIG. 4 can be reduced to monolithic MOS embodiments which can be integrated on the same semiconductive wafer along with the schematically illustrated ramp generator 10, comparator 14, and cross-over network 52. Accordingly, an entirely self-contained, monolithic analog-to-digital converter, (or perhaps more generally, an analog-to-quantized converter, since a pulse width modulated output is also obtainable) is provided in accordance with the present invention.

Figure 8:
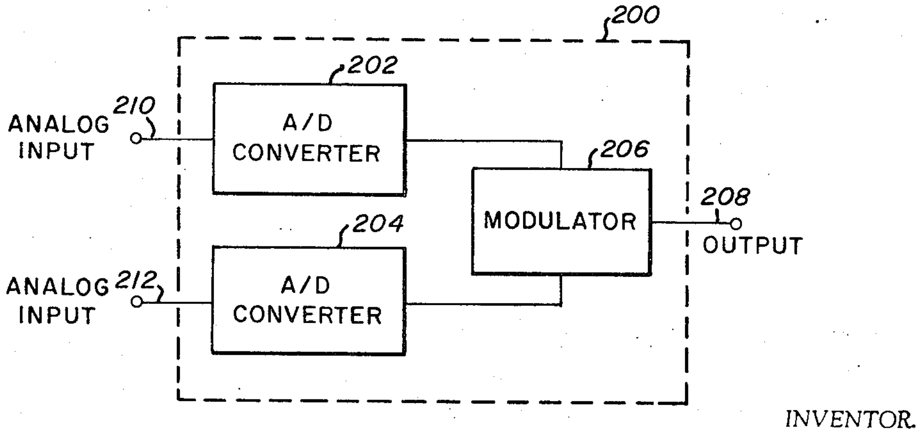
FIG. 8 is a block diagram illustrating a modification of the present invention for providing a parameter compensated output.

Since the converter of the present invention is fully integratable on a single wafer, it will be appreciated that a plurality of such devices can also be provided on a single wafer of semiconductive material, with each converter being usable to provide different information. For example as illustrated in FIG. 8 of the drawing, a pair of converters 202 and 204 might be integrated on a single wafer 200 along with a correction circuit 206 which provides some predetermined interaction between the outputs of the two converts to provide a single corrected, or compensated, output at terminal 208. An analog input of a particular nature might be applied to the input terminal 210 of converter 202 with the output of a temperature sensitive transducer being applied to input terminal 212, in which case the circuit 206 would automatically modify the output of converter 202 in accordance with the output of converter 204 so that a doubly temperature compensated digital output signal is provided at output terminal 208.

Although the various components of the present invention have been disclosed as being formed using monolithic semiconductor techniques on a single semiconductive wafer, it is to be understood that certain components of the circuit could likewise be provided separately and be electrically connected to the remainder of the circuit in an appropriate manner. For example, in some applications it may be more desirable to utilize an external capacitor for the ramp generator capacitor C rather than to use a monolithic capacitor formed on the same wafer as is the remainder of the converter circuit. However, there appear to be substantial advantages in providing the entire ramp voltage generator in monolithic form since all of the circuit components will then be subjected to the same temperature and other environmental conditions. Furthermore, with all of the components on a single wafer the entire converter can be easily packaged in a single IC package.

Although many modifications of the present invention will undoubtedly become apparent to those skilled in the art after having read the above disclosure, it is to be understood that the disclosed embodiment is for purposed of illustration only and is not to be considered as limiting. Accordingly, it is intended that the appended claims be interpreted as including all such modifications as fall within the true spirit and scope of the invention.

What is claimed is:

1. A converter for converting an analog voltage signal to a quantized signal, comprising:

voltage generating means for developing a linearly varying ramp voltage having predetermined time-voltage characteristics, said voltage generating means having a constant current source and a capacitor connected in series, said current source including, a first FET having a first drain coupled to one side of said capacitor, a first source for connection to a source of potential, and a first gate, said first gate being biased to a temperature critical potential chosen by determining the intersection of different temperature transfer characteristics of said first FET, whereby the current flow through said first FET is maintained constant and independent of temperature changes over a predetermined range of temperatures;

voltage comparing means responsive to an unknown input voltage and said ramp voltage, and operative to compare said voltages and develop a coincident signal when they are equal; and means responsive to said coincident signal for developing an output signal commensurate with said unknown voltage.

2. A converter as recited in claim 1 wherein said voltage comparing means includes a first differential amplifier, and said means responsive to said coincidence signal includes, a flip-flop for developing said output signal, a second differential amplifier for driving said flip-flop, and a cross-over network for coupling the output terminals of said first differential amplifier into the input terminals of said second differential amplifier.

3. A converter as recited in claim 1 wherein said voltage generating means further includes, a first switching means in series with said first FET and said capacitor, and a second switching means in parallel with said capacitor.

4. A converter as recited in claim 3 wherein said first switching means includes a second FET, and said second switching means includes a third FET, said second and third FETs being biased to have opposite conductivity states.

5. A converter for converting an analog voltage signal to a quantized signal, comprising:

voltage generating means for developing a linearly varying ramp voltage having predetermined time-voltage characteristics, said voltage generating means including, a constant current source, a capacitor and a first switching means connected in series, and a second switching means connected in parallel with said capacitor, said capacitor having a first electrode for connection to a first source of potential, and a second electrode, said current source including a first FET having a first drain coupled to said second electrode, a first source for connection to a second source of potential, and a first gate for receiving a temperature critical voltage, said first FET being responsive to said temperature critical voltage and operative to provide a fixed current for charging said capacitor at a linear rate independent of temperature, said second switching means including a second FET having a second drain coupled to said first electrode, a second source coupled to said second electrode, and a second gate for receiving a shorting signal, said second FET being responsive to said shorting signal and operative to discharge said capacitor;

voltage comparing means responsive to an unknown input voltage and said ramp voltage, and operative to compare said voltages and develop a coincidence signal when they are equal; and means responsive to said coincidence signal for developing an output signal commensurate with said unknown voltage.

6. An analog-to-digital converter as recited in claim 5 wherein said voltage generating means further includes a third FET having a third drain coupled to said first source, a third source for connection to said second source of potential, and a third gate responsive to a switching signal, said third FET being responsive to said switching signal and operative to interrupt current flow from said second source of potential to said capacitor.

7. In a monolithic analog-to-digital converter including, a voltage generating means for developing a ramp voltage which changes linearly with time, a comparator responsive to an unknown voltage and said ramp voltage and operative to develop a coincidence signal when said ramp voltage equals said unknown voltage, and signal generating means responsive to said coincidence signal and operative to develop an output signal commensurate with the magnitude of said unknown voltage, an improved voltage generating means, comprising:

a capacitor having a first capacitive plate for connection to a first potential supply and a second capacitive plate;

a first FET having a first drain coupled to said second capacitive plate, a first source for connection to a second potential supply, and a first gate for receiving a temperature critical voltage, said first FET being responsive to said temperature critical voltage and operative to provide a fixed charging current to said capacitor which is independent of temperature; and a second FET having a second drain coupled to said first capacitive plate, a second source coupled to said second capacitive plate, and a second gate for receiving a shorting signal, said second FET being responsive to said shorting signal and operative to discharge said capacitor.

8. In a monolithic analog-to-digital converter as recited in claim 7 wherein said temperature critical voltage is determined by the intersection of the different temperature transfer characteristic curves of said first FET.

* * * * *